(12) United States Patent
Liao

(10) Patent No.: US 6,627,551 B2
(45) Date of Patent: Sep. 30, 2003

(54) METHOD FOR AVOIDING MICROSCRATCH IN INTERLEVEL DIELECTRIC LAYER CHEMICAL MECHANICAL POLISHING PROCESS

(75) Inventor: Wei-Wu Liao, Taipei (TW)

(73) Assignee: United Microelectronics Corp., Hsinchu (TW)

( * ) Notice: Subject to any disclaimer, the term of this patent is extended or adjusted under 35 U.S.C. 154(b) by 17 days.

(21) Appl. No.: 09/874,530

(22) Filed: Jun. 6, 2001

(65) Prior Publication Data

US 2002/0187641 A1 Dec. 12, 2002

(51) Int. Cl.[7] .............................. H01L 21/302
(52) U.S. Cl. .................. 438/692; 438/694; 438/697; 438/698; 438/699; 438/723
(58) Field of Search .............................. 438/692, 694, 438/697, 698, 699, 704, 723, 756

(56) References Cited

U.S. PATENT DOCUMENTS

| | | | | |
|---|---|---|---|---|
| 5,804,479 A | * | 9/1998 | Aoki et al. | 438/253 |
| 5,834,806 A | * | 11/1998 | Lin et al. | 257/306 |
| 6,191,046 B1 | * | 2/2001 | Singh et al. | 438/723 |
| 6,335,285 B1 | * | 1/2002 | Chun et al. | 438/692 |

\* cited by examiner

*Primary Examiner*—Robert Kunemund
*Assistant Examiner*—Binh X. Tran

(57) ABSTRACT

This invention discloses a method for avoiding microscratch in interlevel dielectric layer chemical mechanical polishing process. There is step height difference on surface of the interlevel dielectric layer between the memory array and the logic device, so, the interlevel dielectric layer over the memory array is etched to form a sidewall and a corner. As a key step of this invention, a dielectric layer is capped over the interlevel dielectric layer to smooth the corner and avoid microscratch thereon when performing chemical mechanical polishing process.

19 Claims, 4 Drawing Sheets

METHOD FOR AVOIDING MICROSCRATCH IN INTERLEVEL DIELECTRIC LAYER CHEMICAL MECHANICAL POLISHING PROCESS

BACKGROUND OF THE INVENTION

1. Field of the Invention

The present invention generally relates to integrated circuits planarization processes, and more particularly to a chemical mechanical polishing (CMP) process for semiconductor wafers that provides avoid microscratches.

2. Description of the Prior Art

The fabrication of integrated circuits on a semiconductor wafer involves a number of steps where patterns are transferred from photolithographic photomasks onto the wafer. The photomasking processing steps opens selected areas to be exposed on the wafer for subsequent processes such as inclusion of impurities, oxidation, or etching.

During the forming of integrated circuit structures, it has become increasingly important to provide structures having multiple metallization layers due to the continuing miniaturization of the circuit elements in the structure. Each of the metal layers is typically separated from another metal layer by an insulation layer, such as an oxide layer. To enhance the quality of an overlying metallization layer, one without discontinuities of other blemishes, it is imperative to provide an underlying surface for the metallization layer that is ideally planar. The process of planarization is necessary and desirable to facilitate masking and etching operations. Planarization of metal interconnect layers improves the yield of devices contained in the device array of a wafer, and the reliability of such devices. Planarization produces a constant thickness across the circuit of a die, minimizes the presence of cavities, and allows metal interconnect lines to be continuous, where they would otherwise be discontinuous over a non-planar surface containing cavities.

Planarization of integrated circuit devices is necessary and desirable to facilitate masking and etching operations. A planarized surface provides a constant depth of focus across the surface of a die for exposing patterns in a photolithography emulsion. While complete planarization is desirable, it is difficult to achieve as the topology of integrated circuit varies across the surface of a die on a wafer.

Integrated circuits are manufactured by stacking multiple layers of metal, semiconductor, and dielectric materials on a top surface of a semiconductor substrate. Each of these layers may be patterned to create complex microelectronic circuitry. Planarization of each of the layers is an important limitation to the number of layers used to form the integrated circuit devices. Non-planar layers are difficult to pattern using conventional photo resist techniques because the focal length varies across the surface of the semiconductor wafer. It is also difficult to form subsequent films on top of a non-planar layer resulting in voids in the subsequent layer. Also, non-planar layers are difficult to completely remove during an etch process. A number of planarization processes have been developed and include chemical mechanical polishing.

The chemical mechanical polishing process involves holding a thin wafer of semiconductor material against a rotating wetted polish pad surface under a controlled downward pressure. A polishing slurry such as a mixture of either a basic or acidic solution is used as a chemical etch component in combination with an abrasive material such as aluminum or silica particles. A rotating polishing head or wafer carrier is typically used to hold the wafer under controlled pressure against a rotating polishing platen. The polishing platen is typically covered with a relatively soft, porous wetted pad material such as blown polyurethane.

In the conventional DRAM process, transistors 20, 21, a contact 30, and capacitors 40 are formed on a substrate 10, wherein the transistors 20-1, 20-2, 20-3, 20-4, 20-5, a contact 30 and capacitors 40 are components of memory array as shown in part B of FIG. 1. Transistors 21-1, 21-2 are used to control and access data in memory array as shown in part A of FIG. 1. An interlevel dielectric layer 50 is deposited on the memory array B, logic device A and the substrate 10, wherein surface of the interlevel dielectric layer 50 has step height difference between the memory array B and the logic device A. Photoresist layer 60 is formed on a portion of the interlevel dielectric layer 50 over the logic device A by using lithographic process. The interlevel dielectric layer 50 is etched by using the photoresist layer 50 as a mask. Then, a sidewall 70 and a corner 80 are formed in the interlevel dielectric layer 50 between the memory array B and the logic device A at the etching step as shown in FIG. 2. The polishing slurry 90 will pile up around the corner 80, when performing chemical mechanical polishing process. A polishing slurry 90 such as a mixture of either a basic or acidic solution is used as a chemical etch component in combination with an abrasive material such as aluminum or silica particles. They will over polished the interlevel dielectric layer 50, become concave 95 around the corner 80, as shown in FIG. 3, and then cause yield loss and surface contamination.

SUMMARY OF THE INVENTION

In accordance with the present invention, it is a main object of this invention to form a smooth corner of interlevel dielectric layer in a DRAM.

It is another object of this invention that smooth corner is very desirable in the chemical mechanical polishing process avoided microstratch.

This invention discloses a method for avoiding microscratch in interlevel dielectric layer chemical mechanical polishing process. There is step height difference on surface of the interlevel dielectric layer between the memory array and the logic device, so, the interlevel dielectric layer over the memory array is etched to form a sidewall and a corner. As a key step of this invention, a dielectric layer is capped over the interlevel dielectric layer to smooth the corner and avoid microscratch thereon when performing chemical mechanical polishing process.

BRIEF DESCRIPTION OF THE DRAWINGS

The foregoing aspects and many of the attendant advantages of this invention will become more readily appreciated as the same becomes better understood by reference to the following detailed description, when taken in conjunction with the accompanying drawings, wherein.

DESCRIPTION OF THE PREFERRED EMBODIMENT

This method disclosed avoiding microscratch in interlevel dielectric layer chemical mechanical polishing process. In DRAM process, an interlevel dielectric layer is deposited on the substrate, which is divided into two regions, a first device is memory array and a second device is logic device, wherein surface of the interlevel dielectric layer has step height difference between the memory array and the logic device. The interlevel dielectric layer is etched by using the patterned photoresist layer as a mask. A sidewall and a corner are formed in the interlevel dielectric layer between the memory array and the logic device. A dielectric layer is formed on the interlevel dielectric layer to smooth the corner and avoid microscratch thereon when performing chemical mechanical polishing process.

Figure 1:
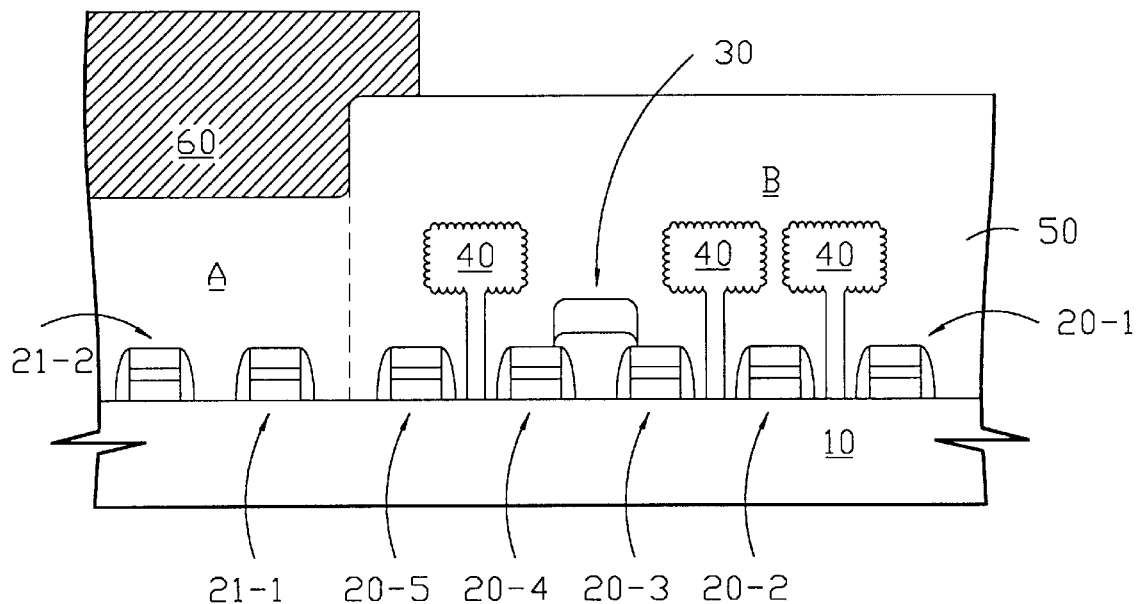
FIG. 1 illustrates in the conventional DRAM process, memory array and logic device are formed on a substrate, and deposit an interlevel dielectric layer over the substrate then etched the interlevel dielectric layer.
Figure 2:
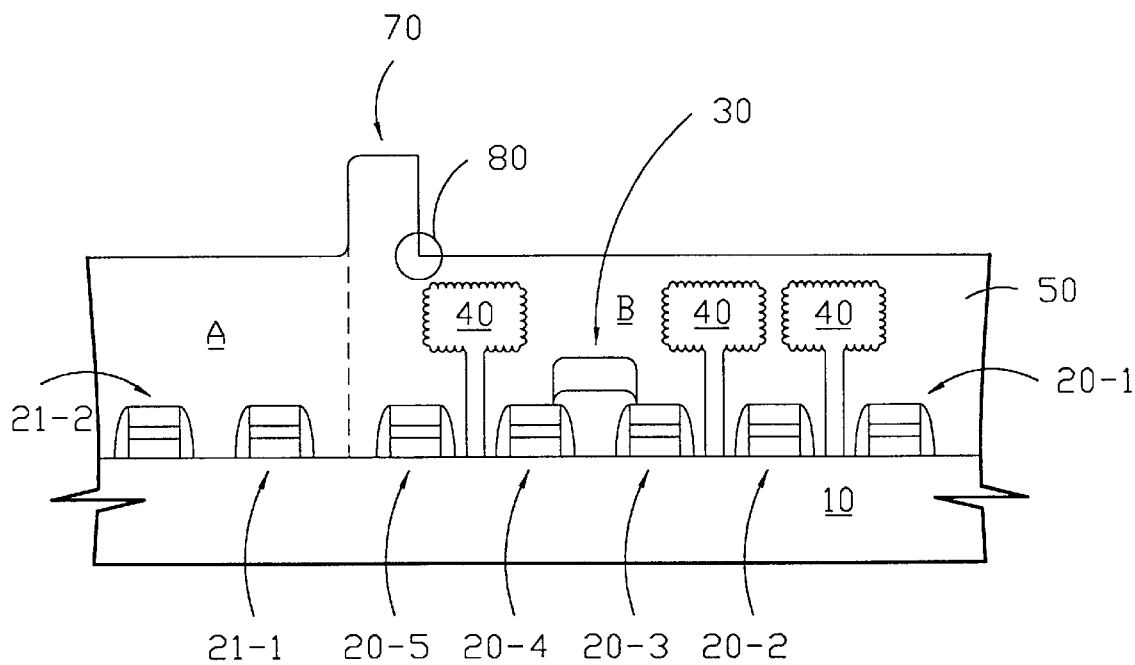
FIG. 2 illustrates continue from FIG. 1 remove the photoresist layer to formed sidewall and corner.
Figure 3:
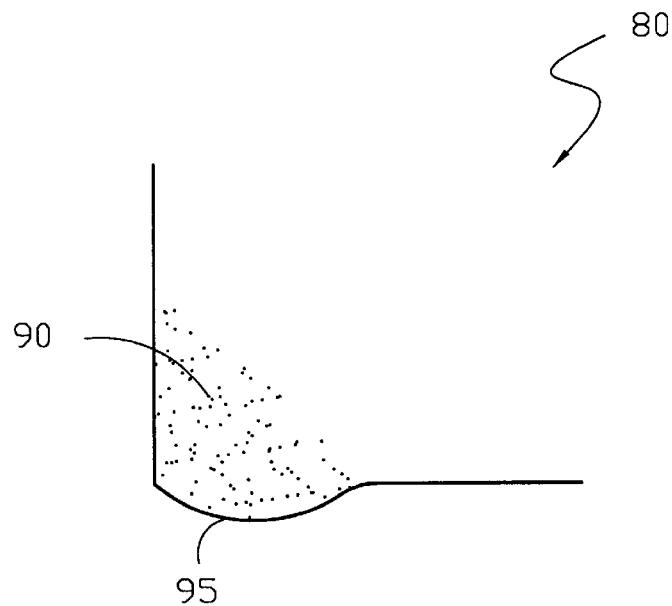
FIG. 3 illustrates enlarge continue from FIG. 2 the corner will pile up slurry particle when performing chemical mechanical polishing process.
Figure 4:
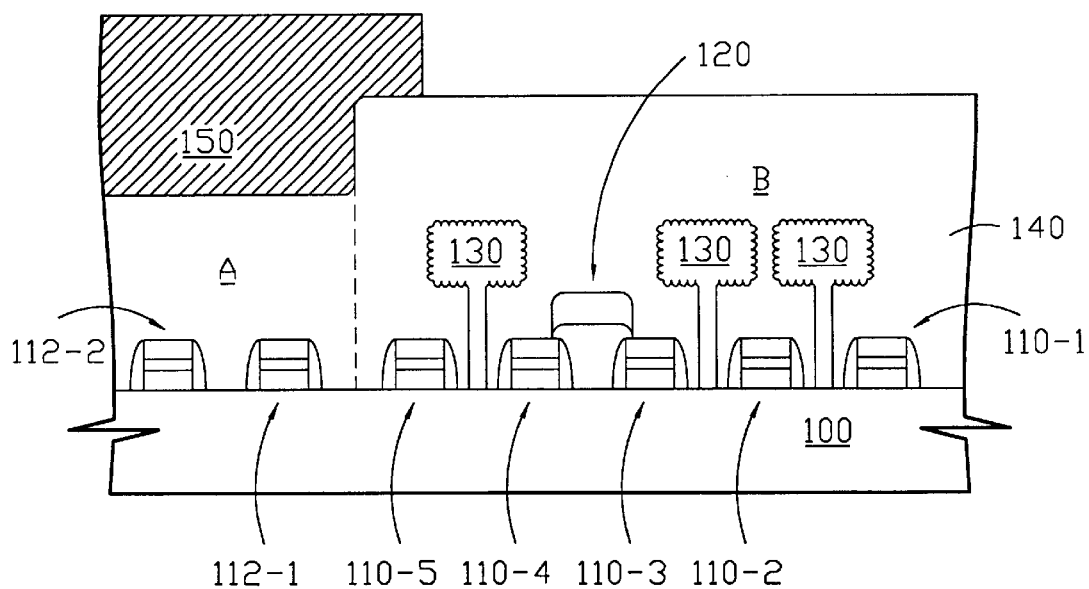
FIG. 4 illustrates this invention in DRAM process, memory array and logic device are formed on a substrate, and deposit an interlevel dielectric layer over the substrate then etched the interlevel dielectric layer.

A simplified DRAM wafer during an initial polishing stage of chemical mechanical polishing process in accordance with the present invention as shown in FIG. 4. In DRAM process, transistors 110, 112, a contact 120, and capacitors 130 are formed on a substrate 100, wherein the transistors 110-1, 110-2, 110-3, 110-4, 110-5, a contact 120 and capacitors 130 are components of memory array as shown in part B of FIG. 4. Transistors 112-1, 112-2 are logic device used to control and access data in memory array as shown in part A of FIG. 4. An interlevel dielectric layer 140 is deposited on the memory array B, logic device A and the substrate 100, wherein surface of the interlevel dielectric layer 140 has step height difference between the memory array B and the logic device A. The material of interlevel dielectric layer 140 may be tetra-ethyl-ortho-silicate (TEOS) by low pressure chemical vapor deposition (LPCVD). Patterned photoresist layer 150 is formed on the interlevel dielectric layer 140 over the logic device A and is on portion of the memory array B by using lithographic process.

Figure 5:
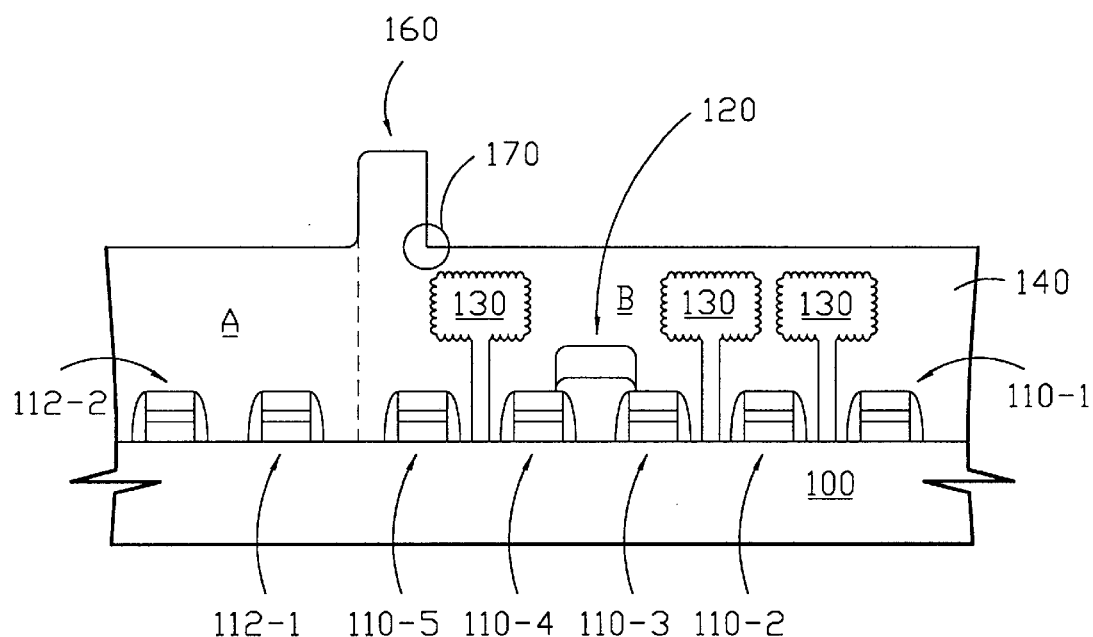
FIG. 5 illustrates this invention continue from FIG. 4 remove the photoresist layer to formed sidewall and corner.

Next, as shown in FIG. 5, the interlevel dielectric layer 140 is etched by using a patterned photoresist layer 150 on the first device B and on portion of the second device A as a mask. Then, a sidewall 160 and a corner 170 are formed in the interlevel dielectric layer 140 between the memory array B and the logic device A at the etching step. The step of etched the interlevel dielectric layer is anisotropical. Thus, the interlevel dielectric layer has a vertical sidewall and similar right angle. The polishing slurry will pile up around the corner 170, when performing chemical mechanical polishing process. A polishing slurry such as a mixture of either a basic or acidic solution is used as a chemical etch component in combination with an abrasive material such as aluminum or silica particles.

Figure 6:
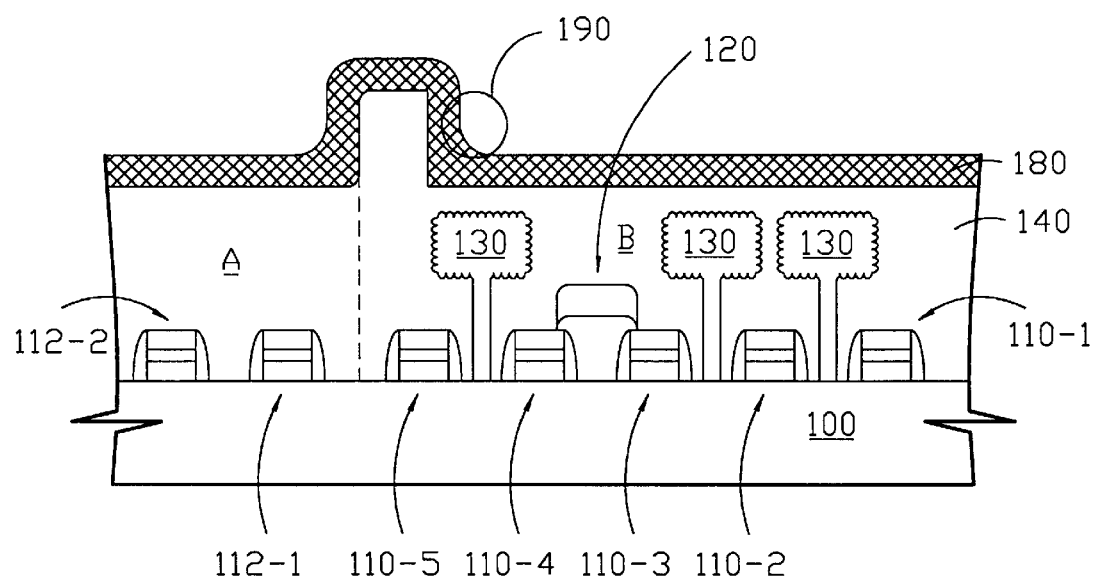
FIG. 6 illustrates this invention continue from FIG. 5 an dielectric layer is deposited on the interlevel dielectric layer to smooth the corner.

As a key step of this invention, next, shown in FIG. 6, for avoiding microscratch in interlevel dielectric layer 140 chemical mechanical polishing process. A thin film must be deposited on the interlevel dielectric layer 140 to smooth the corner 190. The thin film is a dielectric layer 180. The material of dielectric layer 180 may be silicon dioxide ($SiO_2$), silicon nitride ($Si_3N_4$), phosphosilicate glass (PSG), and borophosphosilicate glass (BPSG) or other suitable material. Deposited method may be atmospheric chemical vapor deposition (APCVD), LPCVD and plasma enhanced chemical vapor deposition (PECVD).

Figure 7:
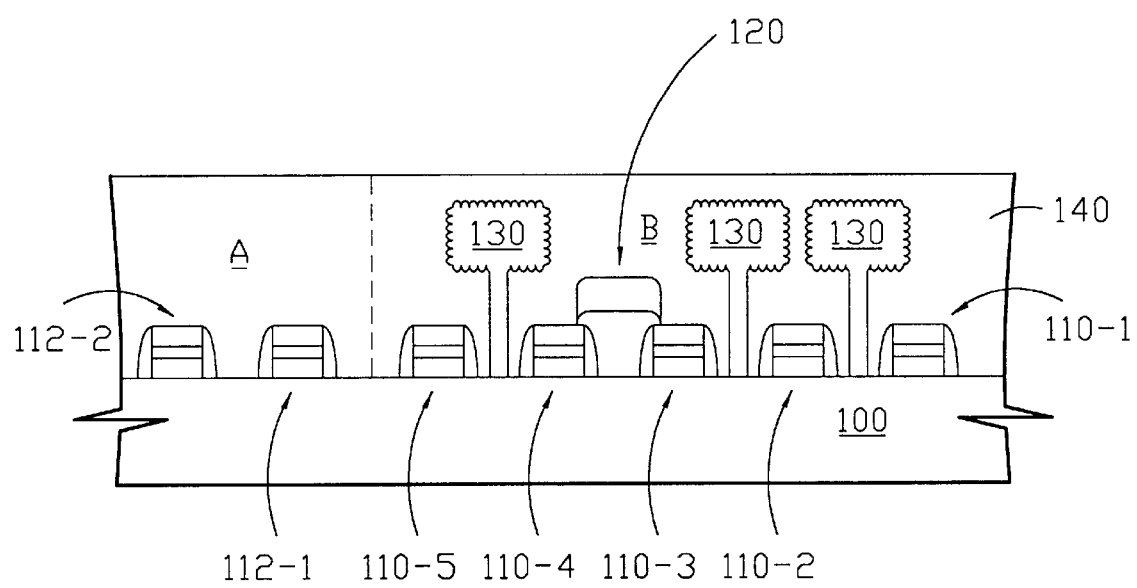
FIG. 7 illustrates this invention continue from FIG. 6 then performing chemical mechanical polishing process.

In this invention, that can used spin-on-glass (SOG) or another material is BPSG co-operate re-flow. The SOG method by silicate and siloxane with solvent spin coating. The BPSG deposited method is by APCVD and re-flow. In this embodiment, BPSG by APCVD and re-flow is preferred. This method obtain a smoothing surface and eliminated corner 170. The smoothing corner 190 avoid pill up slurry particle in chemical mechanical polishing process as shown in FIG. 7.

Although specific embodiments have been illustrated and described, it will be obvious to those skilled in the art that various modifications may be made without departing from what is intended to be limited solely by the appended claims.

What is claimed is:

1. A method for avoiding microscratch in interlevel dielectric layer chemical mechanical polishing process, said method comprising:

providing a substrate having a first device and a second device thereon;

depositing an interlevel dielectric layer on said substrate;

etching said interlevel dielectric layer over said first device by using a patterned photoresist layer on said first device and on portion of said second device as a mask, such that said interlevel dielectric layer has a vertical sidewall and similar right angle;

depositing a dielectric layer on said interlevel dielectric layer;

performing a chemical mechanical polishing process to said dielectric layer and said interlevel dielectric layer.

2. The method according to claim 1, wherein said first device comprising a memory array and said second device comprising a logic device.

3. The method according to claim 1, wherein said material of interlevel dielectric layer is tetra-ethyl-ortho-silicate (TEOS).

4. The method according to claim 3, wherein depositing method of said interlevel dielectric layer is low pressure chemical vapor deposition (LPCVD).

5. The method according to claim 1, wherein the step of etching said interlevel dielectric layer is anisotropical.

6. The method according to claim 1, wherein material of said dielectric layer is selected from the group consisting of silicon dioxide ($SiO_2$), silicon nitride ($Si_3N_4$), phosphosilicate glass (PSG), borophosphosilicate glass (BPSG) and spin on glass (SOG).

7. The method according to claim 6, wherein said BPSG is deposited by atmospheric pressure chemical vapor deposition (APCVD) co-operate re-flow method.

8. A method for avoiding microscratch in interlevel dielectric layer chemical mechanical polishing process, said method comprising:

providing a substrate;

forming a memory array and a logic device on said substrate;

depositing an interlevel dielectric layer on said memory array, said logic device, and said substrate;

forming a patterned photoresist layer on a portion of said interlevel dielectric layer over said logic device by using lithographic process;

etching said interlevel dielectric layer over said memory array by using said patterned photoresist layer on said memory array and on portion of said logic device as a mask, such that said interlevel dielectric layer has a vertical sidewall and similar right angle;

removing said patterned photoresist layer;

depositing a dielectric layer on said interlevel dielectric layer; and performing a chemical mechanical polishing process to said dielectric layer and said interevel dielectric layer.

9. The method according to claim 8, wherein said material of interlevel dielectric layer is tetra-ethyl-ortho-silicate (TEOS).

10. The method according to claim 9, wherein depositing method of said interlevel dielectric layer is by low pressure chemical vapor deposition (LPCVD).

11. The method according to claim 8, wherein the step of etching said interlevel dielectric layer is anisotropical.

12. The method according to claim 8, wherein material of said dielectric layer is selected from the group consisting of silicon dioxide ($SiO_2$), silicon nitride ($Si_3N_4$), phosphosilicate glass (PSG), borophosphosilicate glass (BPSG) and spin on glass (SOG).

13. The method according to claim 12, wherein said BPSG is by atmospheric chemical vapor deposited (APCVD) co-operate re-flow method.

14. A method for avoiding microscratch in interlevel dielectric layer chemical mechanical polishing process, said method comprising:

providing a substrate having a first device and a second device thereon, wherein said first device comprising a memory array and said second device comprising a logic device;

depositing an interlevel dielectric layer in said substrate;

etching a portion of said interlevel dielectric layer over said first device by using a patterned photoresist layer on first device and on portion of said second device as a mask, such that said interlevel dielectric layer has a vertical sidewall and similar right angle;

depositing a dielectric layer on said interlevel dielectric layer; and performing a chemical mechanical polishing process to said dielectric layer and said interlevel dielectric layer.

15. The method according to claim 14, wherein said material of interlevel dielectric layer is tetra-ethyl-ortho-silicate (TEOS).

16. The method according to claim 15, wherein depositing method of said interlevel dielectric layer is low pressure chemical vapor deposition (LPCVD).

17. The method according to claim 14, wherein the step of etching said interlevel dielectric layer is anisotropical.

18. The method according to claim 14, wherein material of said dielectric layer is selected from the group consisting of silicon dioxide ($SiO_2$), silicon nitride ($Si_3N_4$), phosphosilicate glass (PSG), borophosphosilicate glass (BPSG) and spin on glass (SOG).

19. The method according to claim 18, wherein said BPSG is deposited by atmospheric pressure chemical vapor deposition (APCVD) co-operate re-flow method.

* * * * *